United States Patent
Keum et al.

(10) Patent No.: US 12,236,879 B2
(45) Date of Patent: Feb. 25, 2025

(54) DISPLAY PANEL AND DISPLAY DEVICE INCLUDING THE SAME

(71) Applicant: Samsung Display Co., LTD., Yongin-si (KR)

(72) Inventors: Nackhyeon Keum, Yongin-si (KR); Kwangsae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/545,798

(22) Filed: Dec. 19, 2023

(65) Prior Publication Data

US 2024/0312406 A1    Sep. 19, 2024

(30) Foreign Application Priority Data

Mar. 16, 2023  (KR) .......................... 10-2023-0034832

(51) Int. Cl.
   *G09G 3/3233*  (2016.01)
   *H10K 59/88*  (2023.01)

(52) U.S. Cl.
   CPC ........... *G09G 3/3233* (2013.01); *H10K 59/88* (2023.02); *G09G 2300/0413* (2013.01)

(58) Field of Classification Search
   None
   See application file for complete search history.

(56) References Cited

U.S. PATENT DOCUMENTS

| | | | |
|---|---|---|---|
| 9,830,852 B2 * | 11/2017 | Kim ..................... | G09G 3/3225 |
| 2015/0262526 A1 * | 9/2015 | Park ..................... | G09G 3/3233 |
| | | | 345/76 |
| 2016/0218155 A1 * | 7/2016 | Park ..................... | H10K 59/131 |
| 2016/0321990 A1 * | 11/2016 | Kim ..................... | G09G 3/3233 |
| 2022/0319408 A1 * | 10/2022 | Wang ................... | G09G 3/3225 |
| 2023/0105534 A1 * | 4/2023 | Shimoda ............... | G09G 3/3233 |
| | | | 345/690 |

FOREIGN PATENT DOCUMENTS

| | | | |
|---|---|---|---|
| EP | 2058697 A1 * | 5/2009 | ....... G02F 1/136286 |
| KR | 10-0438125 B1 | 7/2004 | |
| KR | 10-2016-0134919 A | 11/2016 | |
| KR | 10-2368772 B1 | 3/2022 | |

* cited by examiner

*Primary Examiner* — Brian M Butcher
(74) *Attorney, Agent, or Firm* — Lewis Roca Rothgerber Christie LLP

(57) ABSTRACT

A display panel includes: first to N-th active pixels, N being an integer greater than 3; and a dummy pixel arranged adjacent to the N-th active pixel in a same pixel column, the dummy pixel including: a dummy driving transistor including a gate electrode connected to a first node, a first electrode connected to a data line configured to transmit a data voltage, and a second electrode connected to a second node; a plurality of dummy compensation transistors connected in parallel to each other between the first node and the second node; a dummy initialization transistor including a gate electrode configured to receive an initialization gate signal, a first electrode configured to receive an initialization voltage, and a second electrode connected to the first node; and a dummy storage capacitor including a first electrode configured to receive a first supply voltage and a second electrode connected to the first node.

20 Claims, 18 Drawing Sheets

DISPLAY PANEL AND DISPLAY DEVICE INCLUDING THE SAME

The present application claims priority to and the benefit of Korean Patent Application No. 10-2023-0034832 filed on Mar. 16, 2023, in the Korean Intellectual Property Office, the entire content of which is incorporated by reference herein.

BACKGROUND

1. Field

Aspect of embodiments of the present inventive concept relate to a display panel and a display device including the same.

2. Description of Related Art

A display panel may include active pixels and dummy pixels arranged adjacent to the active pixels. Dummy pixels arranged on left and right sides of the active pixels may improve defects of the active pixels and allow the active pixels to operate normally. Dummy pixels arranged below the active pixels may improve a luminance difference between active pixels adjacent to the dummy pixels.

The data voltage may be simultaneously applied to two or more active pixels in one pixel column. As the number of active pixels to which the data voltage is simultaneously applied in one pixel column increases, the number of dummy pixels utilized to improve the luminance difference between the active pixels may increase. Accordingly, a dead space in which the dummy pixels are disposed may increase, and power consumption of the display panel may increase.

The above information disclosed in this Background section is only for enhancement of understanding of the background of the invention and therefore it may contain information that does not form the prior art.

SUMMARY

Aspects of embodiments of the present inventive concept are directed to a display panel for reducing (e.g., minimizing) a dead space in which dummy pixels are arranged.

Aspects of embodiments of the present inventive concept are directed to a display device including the display panel.

According to some embodiments of the present inventive concept, there is provided a display panel including: a plurality of active pixels including a first active pixel to an N-th active pixel, N being a natural number of 4 or more; and a dummy pixel arranged adjacent to the N-th active pixel in a same pixel column, the dummy pixel including: a dummy driving transistor including a gate electrode connected to a first node, a first electrode connected to a data line configured to transmit a data voltage, and a second electrode connected to a second node; a plurality of dummy compensation transistors connected in parallel to each other between the first node and the second node; a dummy initialization transistor including a gate electrode configured to receive an initialization gate signal, a first electrode configured to receive an initialization voltage, and a second electrode connected to the first node; and a dummy storage capacitor including a first electrode configured to receive a first supply voltage and a second electrode connected to the first node.

In some embodiments, the dummy compensation transistors include: a dummy first compensation transistor including a gate electrode configured to receive a write gate signal having two active pulses, a first electrode connected to the second node, and a second electrode connected to the first node; and a dummy second compensation transistor including a gate electrode configured to receive a first later write gate signal applied after the write gate signal, a first electrode connected to the second node, and a second electrode connected to the first node.

In some embodiments, an N−1-th active pixel of the plurality of active pixels is configured to receive the data voltage when the dummy pixel receives the data voltage, the dummy first compensation transistor is turned on, and the dummy second compensation transistor is turned off.

In some embodiments, the N-th active pixel is configured to receive the data voltage when the dummy pixel receives the data voltage, the dummy second compensation transistor is turned on, and the dummy first compensation transistor is turned off.

In some embodiments, active pulses of the write gate signal do not overlap active pulses of the first later write gate signal.

In some embodiments, the dummy first compensation transistor and the dummy second compensation transistor are alternately turned on.

In some embodiments, active pulses of the initialization gate signal do not overlap active pulses of the write gate signal and active pulses of the first later write gate signal.

In some embodiments, the display panel further includes: a dummy write transistor configured to connect the data line to the first electrode of the dummy driving transistor, wherein the dummy write transistor is turned on at all times.

In some embodiments, the dummy compensation transistors include: a dummy first compensation transistor including a gate electrode configured to receive a write gate signal having three active pulses, a first electrode connected to the second node, and a second electrode connected to the first node; a dummy second compensation transistor including a gate electrode configured to receive a first later write gate signal applied after the write gate signal, a first electrode connected to the second node, and a second electrode connected to the first node; a dummy third compensation transistor including a gate electrode configured to receive a second later write gate signal applied after the first later write gate signal, a first electrode connected to the second node, and a second electrode connected to the first node; and a dummy fourth compensation transistor including a gate electrode configured to receive a third later write gate signal applied after the second later write gate signal, a first electrode connected to the second node, and a second electrode connected to the first node.

In some embodiments, an N−1-th active pixel and an N−3-th active pixel of the plurality of active pixels are configured to receive the data voltage when the dummy pixel receives the data voltage, the dummy first compensation transistor is turned on, and the dummy second compensation transistor, the dummy third compensation transistor, and the dummy fourth compensation transistor are turned off.

In some embodiments, the N-th active pixel and an N−2-th active pixel of the plurality of active pixels are configured to receive the data voltage when the dummy pixel receives the data voltage, the dummy second compensation transistor is turned on, and the dummy first compensation transistor, the dummy third compensation transistor, and the dummy fourth compensation transistor are turned off.

In some embodiments, an N−1-th active pixel of the plurality of active pixels is configured to receive the data voltage when the dummy pixel receives the data voltage, the dummy first compensation transistor and the dummy third compensation transistor are turned on, and the dummy second compensation transistor and the dummy fourth compensation transistor are turned off.

In some embodiments, the N-th active pixel is configured to receive the data voltage when the dummy pixel receives the data voltage, the dummy second compensation transistor and the dummy fourth compensation transistor are turned on, and the dummy first compensation transistor and the dummy third compensation transistor are turned off.

In some embodiments, active pulses of the first later write gate signal do not overlap active pulses of the write gate signal and active pulses of the second later write gate signal.

In some embodiments, the dummy first compensation transistor, the dummy second compensation transistor, the dummy third compensation transistor, and the dummy fourth compensation transistor are alternately turned on.

In some embodiments, active pulses of the initialization gate signal do not overlap active pulses of the write gate signal, active pulses of the first later write gate signal, and active pulses of the second later write gate signal.

In some embodiments, the display panel further includes: a dummy write transistor configured to connect the data line to the first electrode of the dummy driving transistor, wherein the dummy write transistor is turned on at all times.

In some embodiments, the dummy compensation transistors have a dual gate structure including two gate electrodes, and the dummy initialization transistor has a dual gate structure including two gate electrodes.

According to some embodiments of the present inventive concept, there is provided a display device including: a display panel including a plurality of active pixels including a first active pixel to an N-th active pixel and a dummy pixel arranged adjacent to the N-th active pixel in a same pixel column, N being a natural number of 4 or more; and a display panel driver configured to drive the display panel, wherein the dummy pixel includes: a dummy driving transistor including a gate electrode connected to a first node, a first electrode connected to a data line configured to transmit a data voltage, and a second electrode connected to a second node; a plurality of dummy compensation transistors connected in parallel to each other between the first node and the second node; a dummy initialization transistor including a gate electrode configured to receive an initialization gate signal, a first electrode configured to receive an initialization voltage, and a second electrode connected to the first node; and a dummy storage capacitor including a first electrode configured to receive a first supply voltage and a second electrode connected to the first node.

In some embodiments, the dummy compensation transistors include: a dummy first compensation transistor including a gate electrode configured to receive a write gate signal having two active pulses, a first electrode connected to the second node, and a second electrode connected to the first node; and a dummy second compensation transistor including a gate electrode configured to receive a first later write gate signal applied after the write gate signal, a first electrode connected to the second node, and a second electrode connected to the first node.

Accordingly, an image may be displayed with uniform luminance, and the display quality may be improved.

According to the display panel and the display device including the display panel according to some embodiments, the display panel may include the active pixels and the dummy pixel arranged adjacent to the active pixels in the same pixel column. The dummy pixel may include the dummy compensation transistors. Accordingly, although the display panel may include only one dummy pixel row, the luminance difference between the active pixels may be improved, a dead space in which the dummy pixel row is arranged may be reduced, and the power consumption of the display panel may be reduced.

BRIEF DESCRIPTION OF THE DRAWINGS

The above and other features of embodiments of the present inventive concept will become more apparent by describing in detailed embodiments thereof with reference to the accompanying drawings, in which.

DETAILED DESCRIPTION

Figure 1:
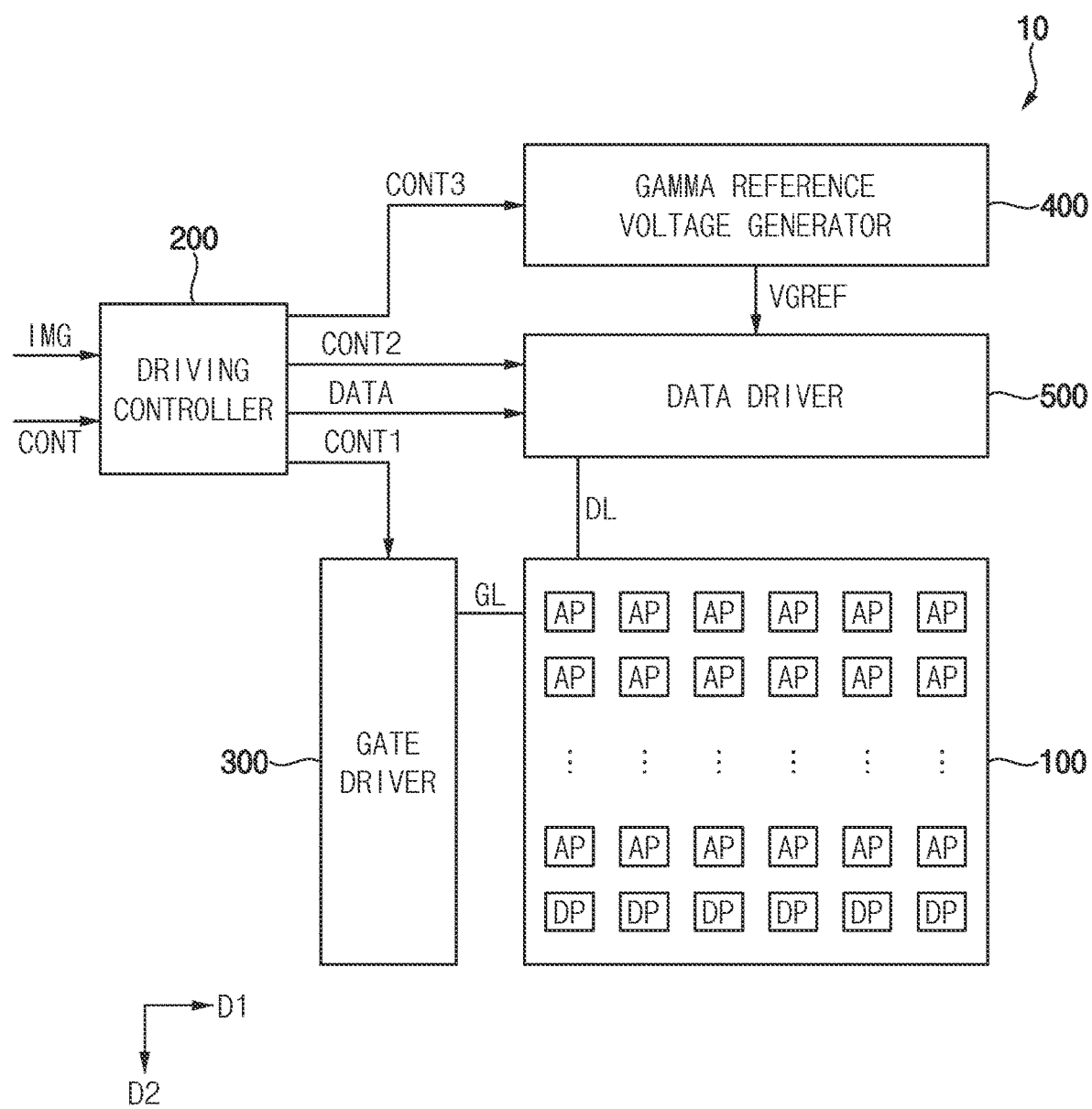
FIG. 1 is a block diagram illustrating a display device according to some embodiments of the present inventive concept.

The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art.

Hereinafter, the present invention will be described in detail by explaining exemplary embodiments of the inventive concept with reference to the attached drawings. Like reference numerals in the drawings denote like elements, and their descriptions may not be provided. Sizes of components in the drawings may be exaggerated for convenience of explanation. In other words, because sizes and thicknesses of components in the drawings are arbitrarily illustrated for convenience of explanation, the following exemplary embodiments are not limited thereto.

FIG. 1 is a block diagram illustrating a display device 10 according to some embodiments of the present inventive concept.

Referring to FIG. 1, a display device 10 may include a display panel 100 and a display panel driver. The display panel driver may include a driving controller 200, a gate driver 300, a gamma reference voltage generator 400, and a data driver 500.

For example, the driving controller 200 and the data driver 500 may be integrally formed. For example, the driving controller 200, the gamma reference voltage generator 400, and the data driver 500 may be integrally formed. For example, the driving controller 200, the gate driver 300, the gamma reference voltage generator 400, and the data driver 500 may be integrally formed. A driving module including at least the driving controller 200 and the data driver 500 which are integrally formed may be referred to as a timing controller embedded data driver (TED).

The display panel 100 may include a display region displaying an image and a peripheral region disposed adjacent to the display region.

For example, the display panel 100 may be an organic light emitting diode display panel including organic light emitting diodes. For example, the display panel 100 may be a quantum-dot organic light emitting diode display panel including organic light emitting diodes and quantum-dot color filters. For example, the display panel 100 may be a quantum-dot nano light emitting diode display panel including nano light emitting diodes and quantum-dot color filters.

The display panel 100 may include gate lines GL, data lines DL, and active pixels AP and dummy pixels DP electrically connected to the gate lines GL and the data lines DL. The gate lines GL may extend in a first direction D1, and the data lines DL may extend in a second direction D2 crossing the first direction D1.

The driving controller 200 may receive input image data IMG and an input control signal CONT from an external device. For example, the input image data IMG may include red image data, green image data, and blue image data. The input image data IMG may further include white image data. The input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 200 may generate a first control signal CONT1, a second control signal CONT2, a third control signal CONT3, and a data signal DATA based on the input image data IMG and the input control signal CONT.

The driving controller 200 may generate the first control signal CONT1 for controlling an operation of the gate driver 300 based on the input control signal CONT, and output the first control signal CONT1 to the gate driver 300. The first control signal CONT1 may include a vertical start signal and a gate clock signal.

The driving controller 200 may generate the second control signal CONT2 for controlling an operation of the data driver 500 based on the input control signal CONT, and output the second control signal CONT2 to the data driver 500. The second control signal CONT2 may include a horizontal start signal and a load signal.

The driving controller 200 may generate the data signal DATA based on the input image data IMG. The driving controller 200 may output the data signal DATA to the data driver 500.

The driving controller 200 may generate the third control signal CONT3 for controlling an operation of the gamma reference voltage generator 400 based on the input control signal CONT, and output the third control signal CONT3 to the gamma reference voltage generator 400.

The gate driver 300 may generate gate signals for driving the gate lines GL in response to the first control signal CONT1 received from the driving controller 200. The gate driver 300 may output the gate signals to the gate lines GL.

In some embodiments, the gate driver 300 is integrated on the peripheral region of the display panel 100.

The gamma reference voltage generator 400 may generate a gamma reference voltage VGREF in response to the third control signal CONT3 received from the driving controller 200. The gamma reference voltage generator 400 may provide the gamma reference voltage VGREF to the data driver 500. The gamma reference voltage VGREF may have a value corresponding to each data signal DATA.

In some embodiments, the gamma reference voltage generator 400 is disposed in the drive controller 200 or the data driver 500.

The data driver 500 may receive the second control signal CONT2 and the data signal DATA from the driving controller 200 and receive the gamma reference voltage VGREF from the gamma reference voltage generator 400. The data driver 500 may convert the data signal DATA into a data voltage in analog form. The data driver 500 may output the data voltage to the data line DL.

Figure 2A:
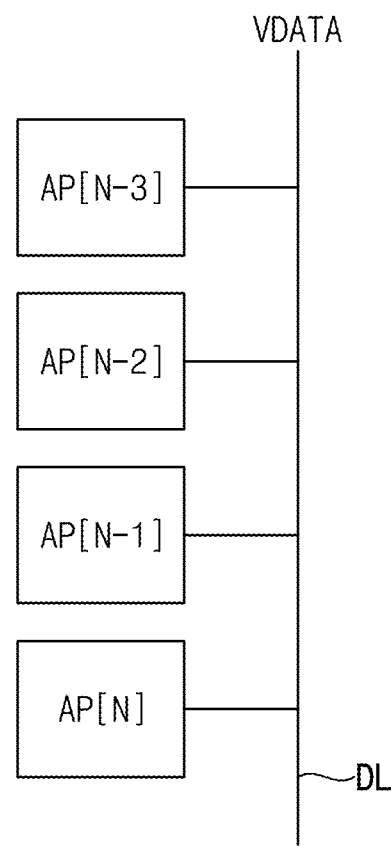
FIG. 2A is a block diagram illustrating an example of a pixel column included in a display device 10 of the related art, which does not include a dummy pixel.
Figure 2B:
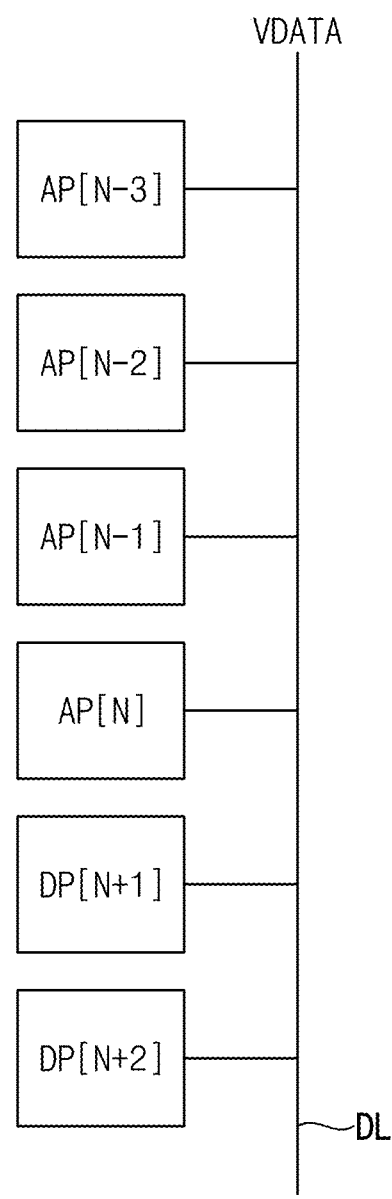
FIG. 2B is a block diagram illustrating an example of a pixel column included in a display device 10 of the related art, which does include a dummy pixel.

FIG. 2A is a block diagram illustrating an example of a pixel column included in a display device 10 of the related art, which does not include a dummy pixel, and FIG. 2B is a block diagram illustrating an example of a pixel column included in a display device 10 of the related art, which does include a dummy pixel.

Referring to FIGS. 1 and 2, the display device 10 of the related art may include a display panel 100. The display panel 100 may include active pixels AP in first to N-th pixel rows. The display panel 100 may include dummy pixels DP[N+1] and DP[N+2] arranged in pixel rows from the N+1-th pixel row (i.e., lower side of the active pixels AP). The dummy pixels DP[N+1] and DP[N+2] may improve (e.g., increase) a luminance difference between the active pixels AP adjacent to the dummy pixels DP[N+1] and DP[N+2].

For example, as illustrated in FIG. 2A, a pixel column of the display device 10 of the related art may not include dummy pixels. The pixel column of the display device 10 of the related art may include an N−3-th active pixel AP[N−3], an N−2-th active pixel AP[N−2], an N−1-th active pixel AP[N−1], and an N-th active pixel AP[N]. A data voltage VDATA may be concurrently (e.g., simultaneously) applied to one active pixel AP through a data line DL, and in some cases, may be concurrently (e.g., simultaneously) applied to two or more active pixels AP. In addition, when the data voltage VDATA is concurrently (e.g., simultaneously) applied to two or more active pixels AP, the data voltage VDATA may be applied to one active pixel AP, or may be applied to a next second active pixel AP while skipping a next first active pixel AP. For example, the data voltage VDATA may be applied to the N−3-th active pixel AP[N−3] and the N−1-th active pixel AP[N−1]. Then, the data voltage VDATA may be applied to the N−2-th active pixel AP[N−2] and the N-th active pixel AP[N]. Unlike the previous case, the data voltage VDATA may be applied only to the N−1-th active pixel AP[N−1]. Next, the data voltage VDATA may be applied only to the N-th active pixel AP[N]. Therefore, when the data voltage VDATA is applied only to the N−1-th active pixel AP[N−1] or the N-th active pixel AP[N], a luminance difference may occur between the N−1-th active pixel AP[N−1] and the N-th active pixel AP[N].

To solve this problem, as illustrated in FIG. 2B, the pixel column of the display device 10 of the related art may include the active pixels AP in the first to N-th pixel rows, and may include the dummy pixels DP[N+1] and DP[N+2] arranged in a plurality of pixel rows from the N+1-th pixel row (i.e., the lower side of the active pixels AP). For example, the data voltage VDATA may be concurrently (e.g., simultaneously) applied to two or more active pixels AP, and the dummy pixels DP may include an N+1-th dummy pixel DP[N+2] and an N+2-th dummy pixel DP[N+1]. Therefore, after the data voltage VDATA is applied to the N−2-th active pixel AP[N−2] and the N-th active pixel AP[N], the data voltage VDATA may be applied to the N−1-th active pixel AP[N−1] and the N+1-th dummy pixel DP[N+1]. Next, the data voltage VDATA may be applied to the N-th active pixel AP[N] and the N+2-th dummy pixel DP[N+2]. As described above, the pixel column of the display device 10 of the related art includes the dummy pixels DP[N+1] and DP[N+2], so that the luminance difference between the active pixels AP[N−1] and AP[N] arranged adjacent to the dummy pixels DP[N+1] and DP[N+2] may be improved.

However, as the number of the active pixels AP to which the data voltage VDATA is concurrently (e.g., simultaneously) applied in the pixel column increases, the number of the dummy pixels DP utilized to improve the luminance difference between the active pixels AP may increase. Thus, in the related art, a dead space in which the dummy pixels DP are arranged may increase, and power consumption of the display panel 100 may increase.

Figure 3A:
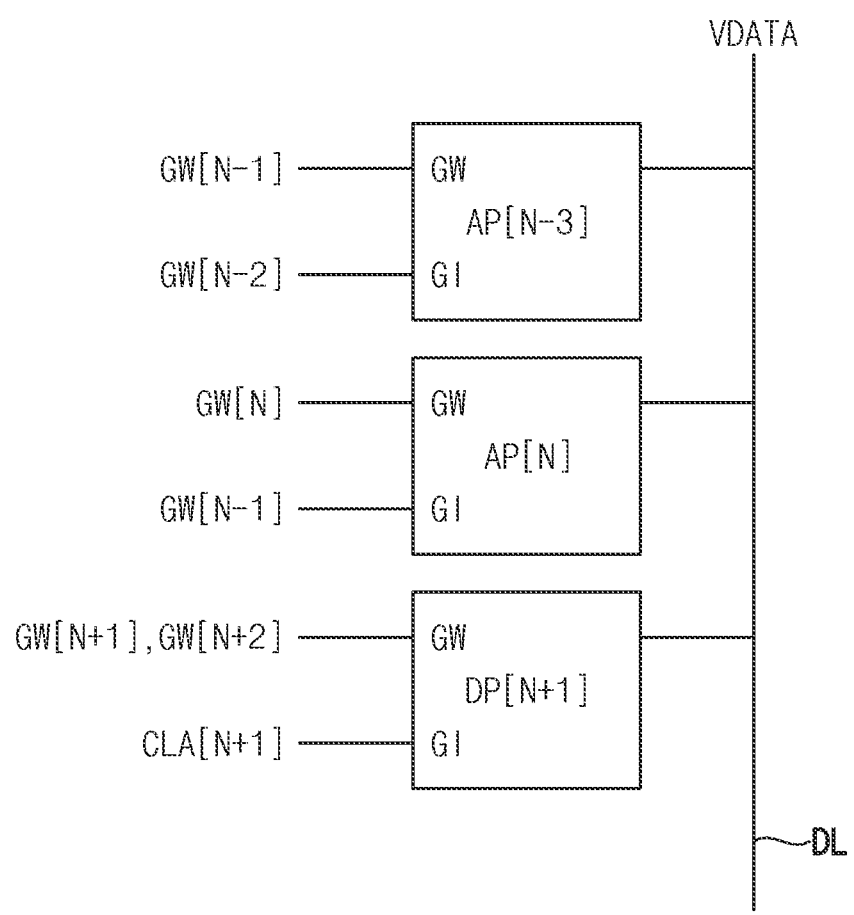
FIG. 3A is a block diagram illustrating an example of a pixel column included in the display device of FIG. 1, according to some embodiments of the present inventive concept.
Figure 3B:
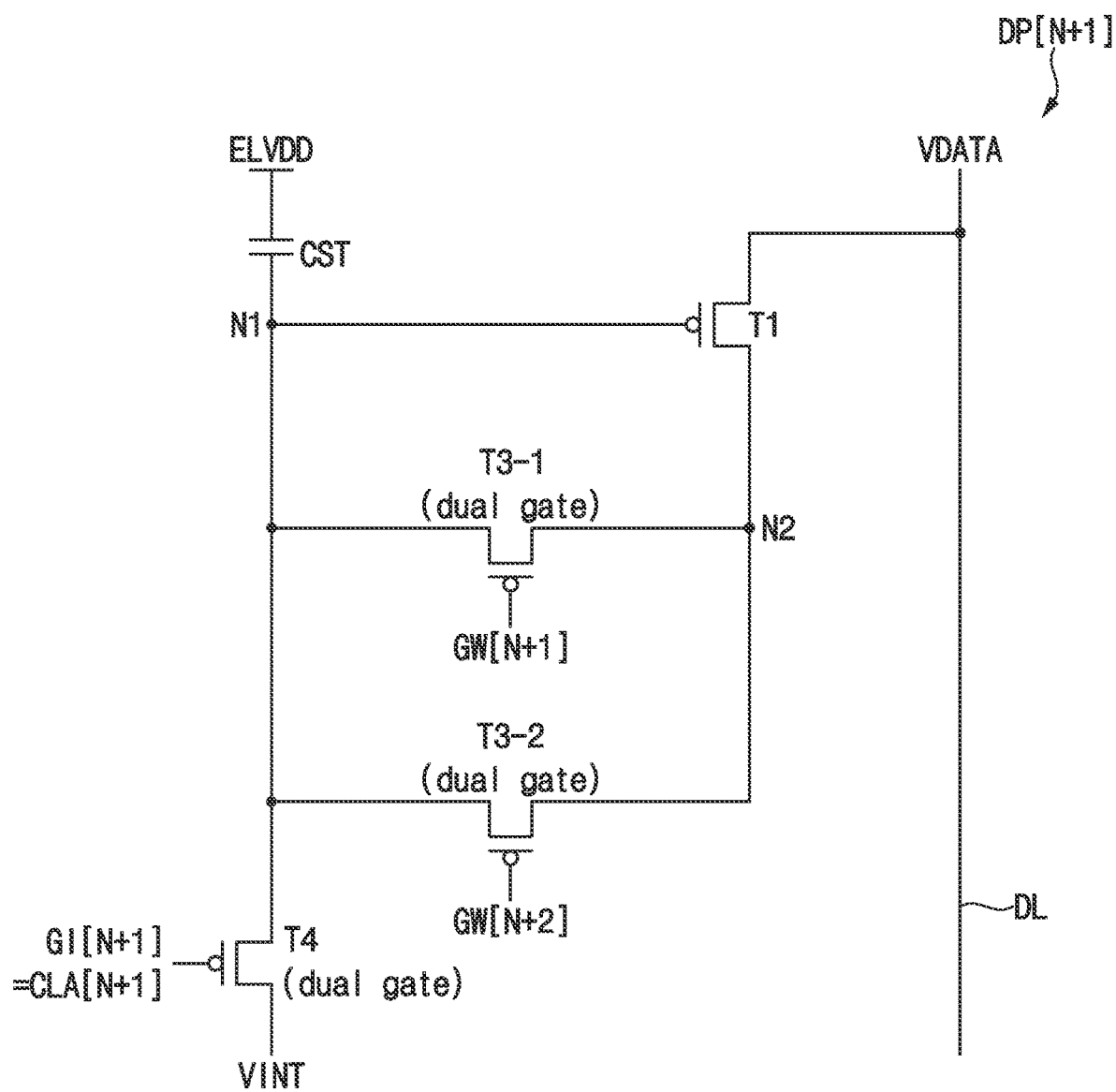
FIG. 3B is a circuit diagram illustrating an example of the dummy pixel included in the pixel column of FIG. 3A, according to some embodiments of the present inventive concept.
Figure 3C:
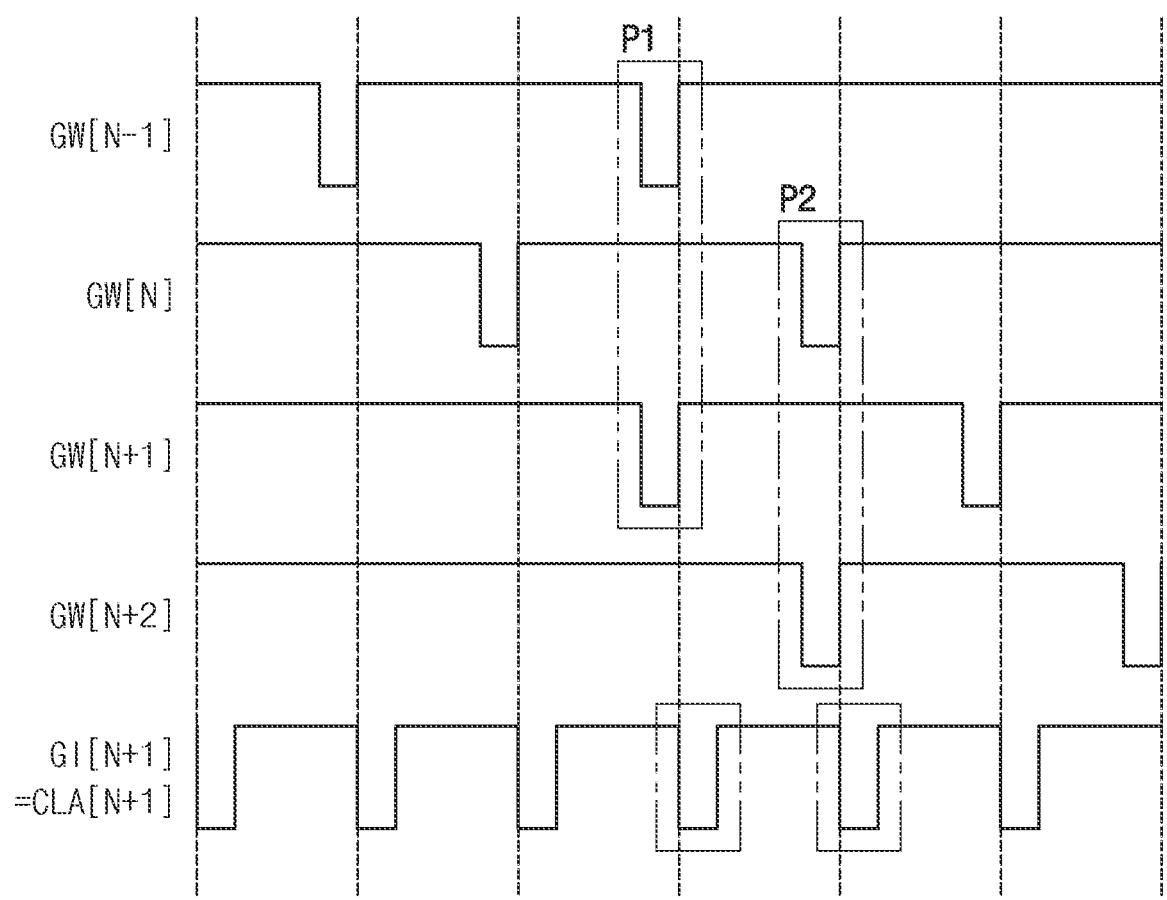
FIG. 3C is a timing diagram illustrating an operation of the dummy pixel of FIG. 3B, according to some embodiments of the present inventive concept.
Figure 3D:
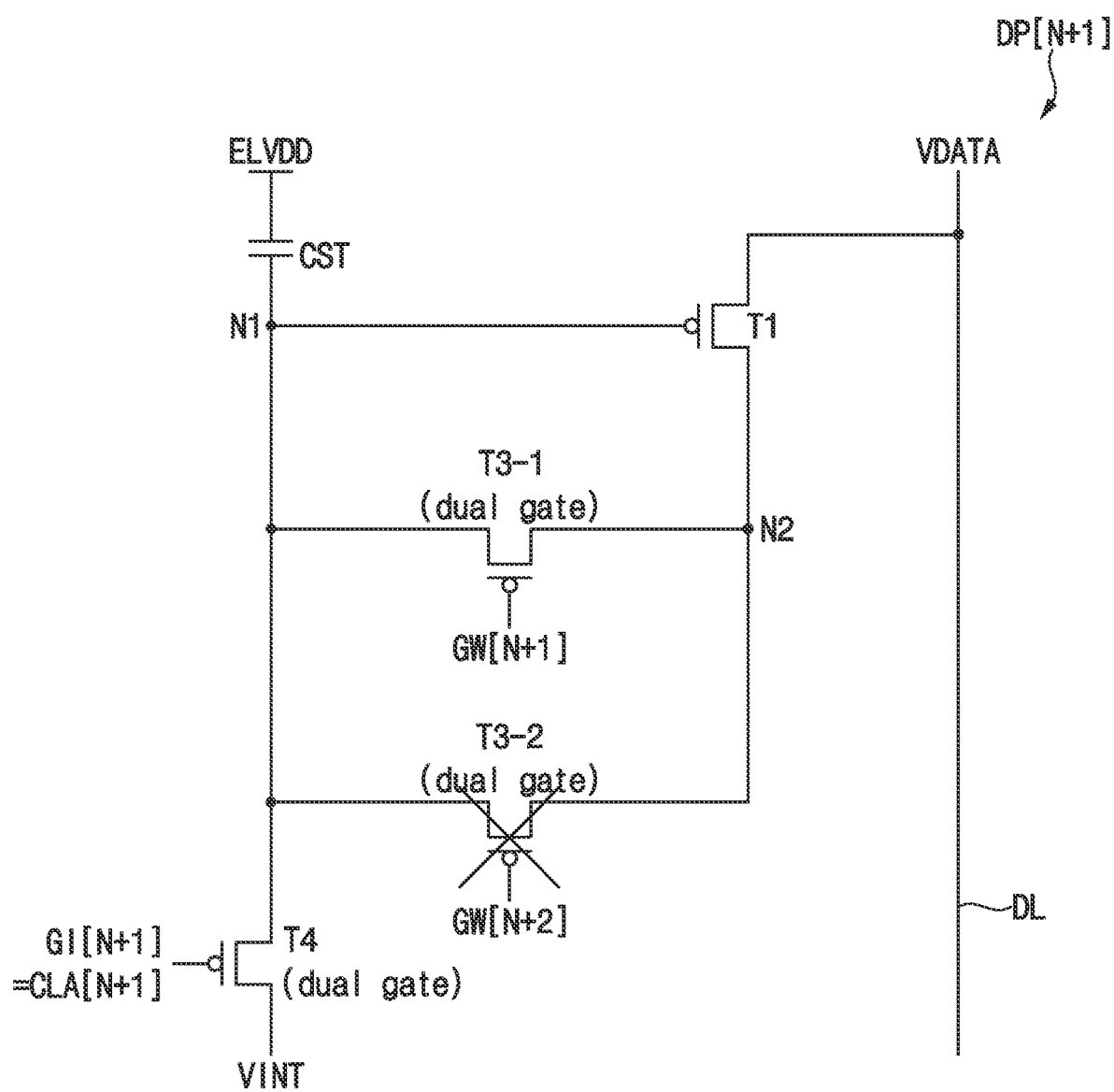
FIGS. 3D and 3E are circuit diagrams illustrating an operation of the dummy pixel of FIG. 3C, according to some embodiments of the present inventive concept.
Figure 3E:
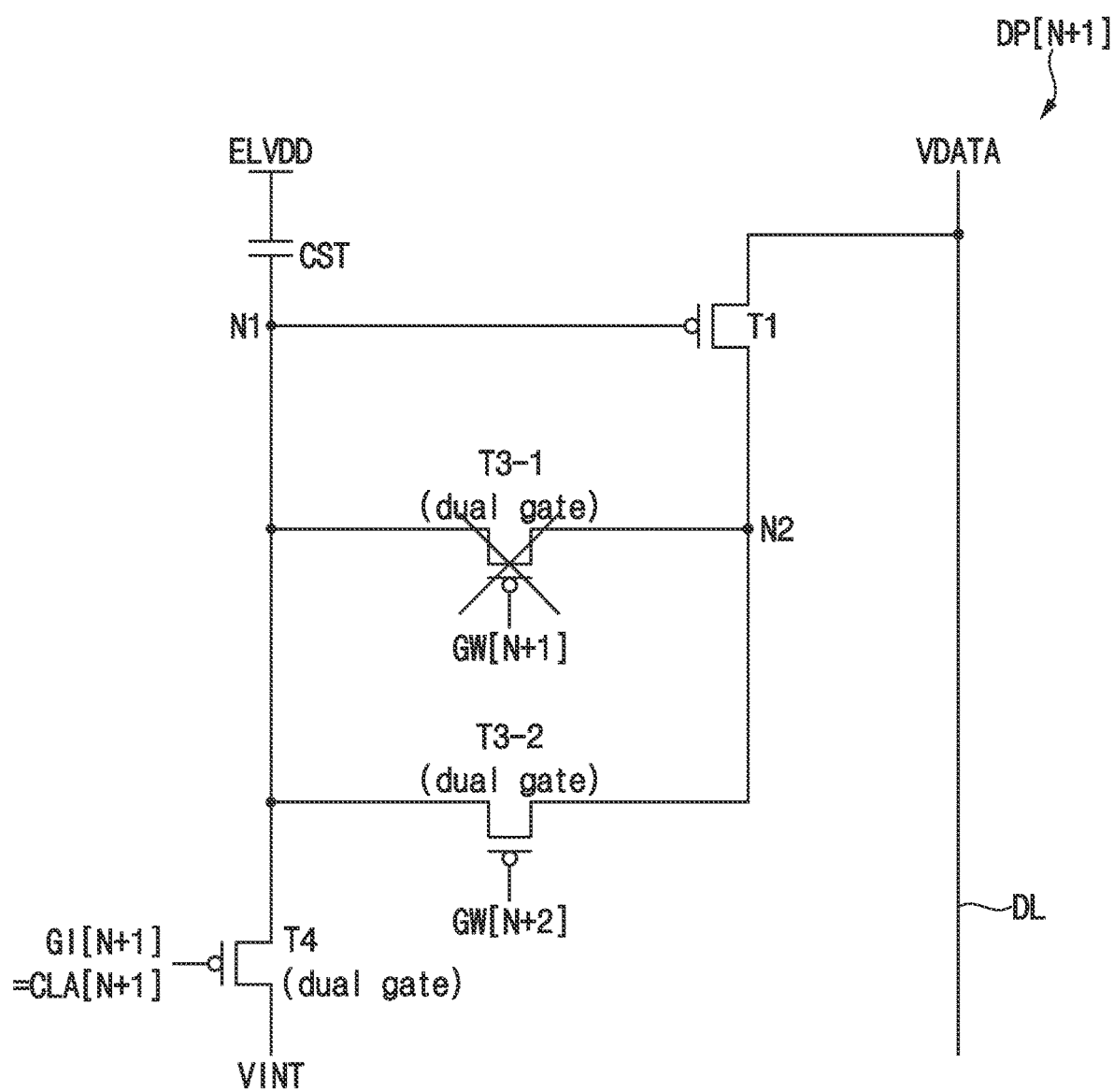
Figure 3F:
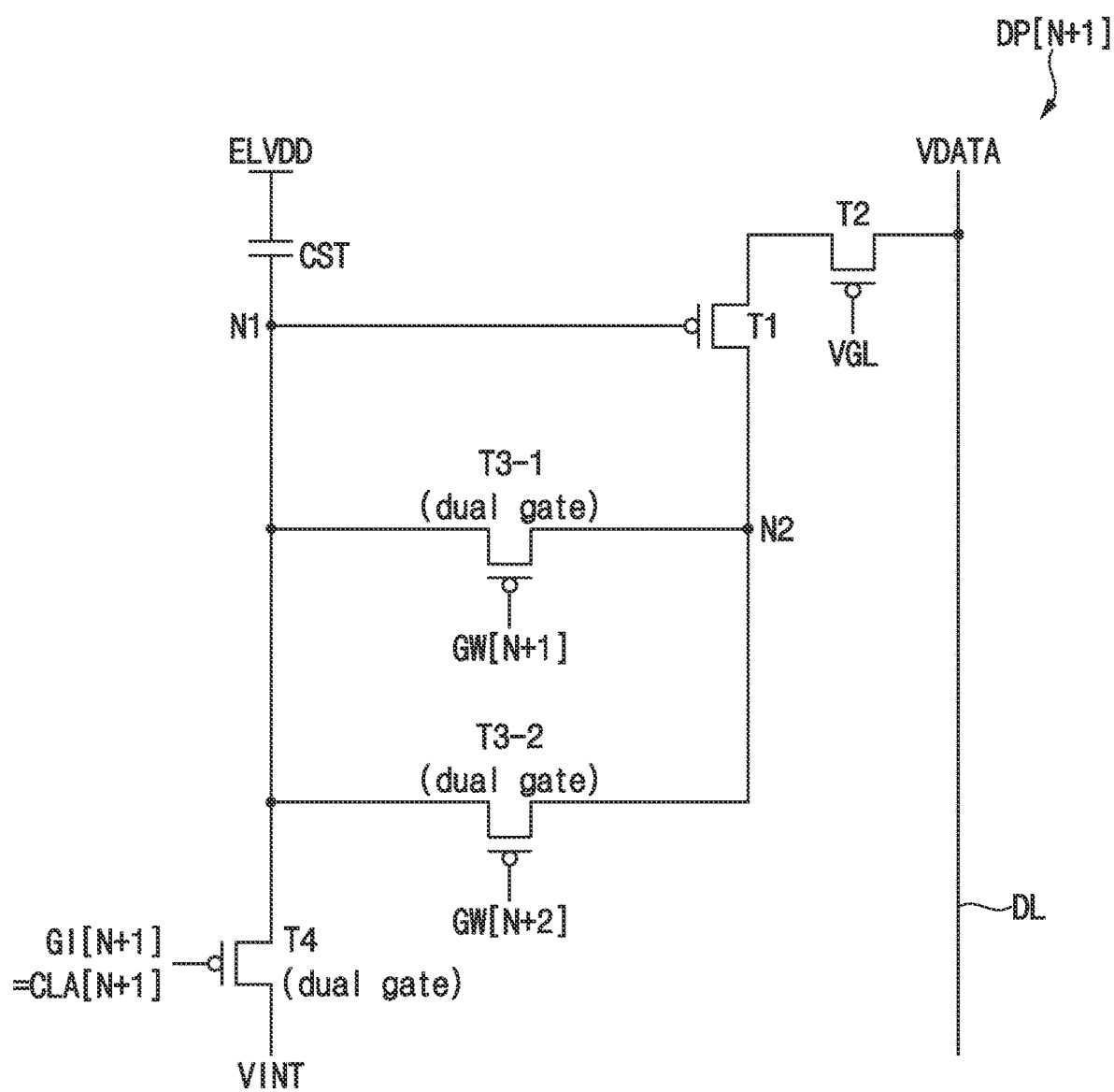
FIG. 3F is a circuit diagram illustrating an example of the dummy pixel of FIG. 3A, according to some embodiments of the present inventive concept.

FIG. 3A is a block diagram illustrating an example of a pixel column included in the display device 10 of FIG. 1, according to some embodiments of the present inventive concept. FIG. 3B is a circuit diagram illustrating an example of the dummy pixel DP[N+1] included in the pixel column of FIG. 3A, according to some embodiments of the present inventive concept. FIG. 3C is a timing diagram illustrating an operation of the dummy pixel DP[N+1] of FIG. 3B, according to some embodiments of the present inventive concept. FIGS. 3D and 3E are circuit diagrams illustrating an operation of the dummy pixel DP[N+1] of FIG. 3C, according to some embodiments of the present inventive concept. FIG. 3F is a circuit diagram illustrating an example of the dummy pixel DP[N+1] of FIG. 3A, according to some embodiments of the present inventive concept.

Referring to FIGS. 1 to 3F, as illustrated in FIG. 3A, the display panel 100 according to some embodiments of the present inventive concept includes the active pixels AP in the first to N-th pixel rows. The display panel 100 may include the dummy pixels DP[N+1] in the N+1-th pixel row. That is, in one pixel column, the display panel 100 may include the first to N-th active pixels AP[1]-AP[N] and one dummy pixel DP[N+1] (where N is a natural number of 4 or more).

As illustrated in FIG. 3B, the dummy pixel DP[N+1] may include a dummy driving transistor T1, a plurality of dummy compensation transistors T3-1 and T3-2, a dummy initialization transistor T4, and a dummy storage capacitor CST. The dummy compensation transistors may include a dummy first compensation transistor T3-1 and a dummy second compensation transistor T3-2. In some embodiments, as illustrated in FIG. 3F, the dummy pixel DP[N+1] further includes a dummy write transistor T2 configured to connect the data line DL to the dummy driving transistor T1, and the dummy driving transistor T1 may be turned on at all times.

The dummy driving transistor T1 may include a gate electrode connected to a first node N1, a first electrode connected to the data line DL which transmits the data voltage VDATA, and a second electrode connected to a second node N2.

The dummy compensation transistors may be connected in parallel to each other between the first node N1 and the second node N2. The dummy first compensation transistor T3-1 may include a gate electrode configured to receive an N+1-th write gate signal GW[N+1] (e.g., a write gate signal), a first electrode connected to the second node N2, and a second electrode connected to the first node N1. The dummy second compensation transistor T3-2 may include a gate electrode configured to receive an N+2-th write gate signal GW[N+2] (e.g., a first later write gate signal) applied after the N+1-th write gate signal GW[N+1], a first electrode connected to the second node N2, and a second electrode connected to the first node N1. As illustrated in FIG. 3C, the N+1-th write gate signal GW[N+1] and the N+2-th write gate signal GW[N+2] may have two active pulses. The active pulses of the N+1-th write gate signal GW[N+1] may not overlap the active pulses of the N+2-th write gate signal GW[N+2]. When each of the dummy first compensation transistor T3-1 and the dummy second compensation transistor T3-2 is turned on, the data voltage VDATA may be applied to the first node N1 through each of the dummy first compensation transistor T3-1 and the dummy second compensation transistor T3-2.

The dummy initialization transistor T4 may include a gate electrode configured to receive an initialization gate signal CLA[N+1], a first electrode configured to receive an initialization voltage VINT, and a second electrode connected to the first node N1. When the dummy initialization transistor T4 is turned on, the initialization voltage VINT may be applied to the first node N1. Therefore, the voltage of the first node N1 may be initialized to the initialization voltage VINT.

The dummy write transistor T2 may include a gate electrode configured to receive a low gate voltage VGL, a first electrode connected to the data line DL, and a second electrode connected to the first electrode of the dummy driving transistor T1. Therefore, the dummy write transistor T2 may be turned on at all times, and may transmit the data voltage VDATA to the first electrode of the dummy driving transistor T1.

In some embodiments, each of the dummy driving transistor T1, the dummy write transistor T2, the dummy first compensation transistor T3-1, the dummy second compensation transistor T3-2, and the dummy initialization transistor T4 is a P-type transistor (e.g., a PMOS transistor). In some other embodiments, each of the dummy driving transistor T1, the dummy write transistor T2, the dummy first compensation transistor T3-1, the dummy second compensation transistor T3-2, and the dummy initialization transistor T4 is an N-type transistor (e.g., an NMOS transistor).

In some embodiments, the dummy first compensation transistor T3-1 has a dual gate structure including two gate electrodes. In some embodiments, the dummy second compensation transistor T3-2 has a dual gate structure including two gate electrodes. In some embodiments, the dummy initialization transistor T4 has a dual gate structure including two gate electrodes.

The dummy storage capacitor CST may include a first electrode configured to receive a first supply voltage ELVDD and a second electrode connected to the first node N1. The dummy storage capacitor CST may store a voltage of the first node N1.

To improve (e.g., increase) the luminance difference between the active pixels AP (i.e., the N−1-th active pixel AP[N−1] and the N-th active pixel AP[N]) arranged adjacent to the dummy pixel DP[N+1], the dummy pixel DP[N+1] may include the dummy compensation transistors T3-1 and T3-2.

To improve (e.g., increase) the luminance difference between the active pixels AP (i.e., the N−1-th active pixel AP[N−1] and the N-th active pixel AP[N]) arranged adjacent to the dummy pixel DP[N+1], the dummy compensation transistors T3-1 and T3-2 may be alternately turned on.

In a first period P1, the N−1-th write gate signal GW[N−1] and the N+1-th write gate signal GW[N+1] may have the active pulses. In the first period P1, when the dummy pixel DP[N+1] receives the data voltage VDATA, the dummy first compensation transistor T3-1 is turned on, and the dummy second compensation transistor T3-2 is turned off, the N−1-th active pixel AP[N−1] may receive the data voltage VDATA. The data voltage VDATA may be applied to the first node N1 through the dummy first compensation transistor T3-1. Therefore, the dummy storage capacitor CST may store the voltage of the first node N1.

In a second period P2, the N-th write gate signal GW[N] and the N+2-th write gate signal GW[N+2] may have the active pulses. In the second period P2, when the dummy pixel DP[N+1] receives the data voltage VDATA, the dummy second compensation transistor T3-2 is turned on, and the dummy first compensation transistor T3-1 is turned off, the N-th active pixel AP[N] may receive the data voltage VDATA. The data voltage VDATA may be applied to the first node N1 through the dummy second compensation transistor T3-2. Therefore, the dummy storage capacitor CST may store the voltage of the first node N1.

Active pulses of the initialization gate signal CLA[N+1] may not overlap (e.g., overlap in time) the active pulses of the write gate signal. Therefore, an operation of initializing the voltage of the first node N1 to the initialization voltage VINT may not overlap an operation of applying the data voltage VDATA to the first node N1 in time.

As described above, the dummy pixel DP[N+1] may include the dummy compensation transistors T3-1 and T3-2 based on the number of the active pulses of the write gate signal. The dummy compensation transistors T3-1 and T3-2 may be alternately turned on, the data voltage VDATA may be applied to the first node N1 through the dummy compensation transistors T3-1 and T3-2, and the dummy storage capacitor CST may store the voltage of the first node N1.

In summary, the display panel 100 and the display device 10, according to some embodiments, includes the active pixels AP and the dummy pixel DP[N+1] arranged adjacent to the active pixels AP in the same pixel column. The dummy pixel DP[N+1] may include the dummy compensation transistors T3-1 and T3-2. Accordingly, although the display panel 100, according to some embodiment, includes only one dummy pixel row, the luminance difference between the active pixels AP may be improved, the dead space in which the dummy pixel row is arranged may be reduced, and the power consumption of the display panel 100 may be reduced.

Figure 4A:
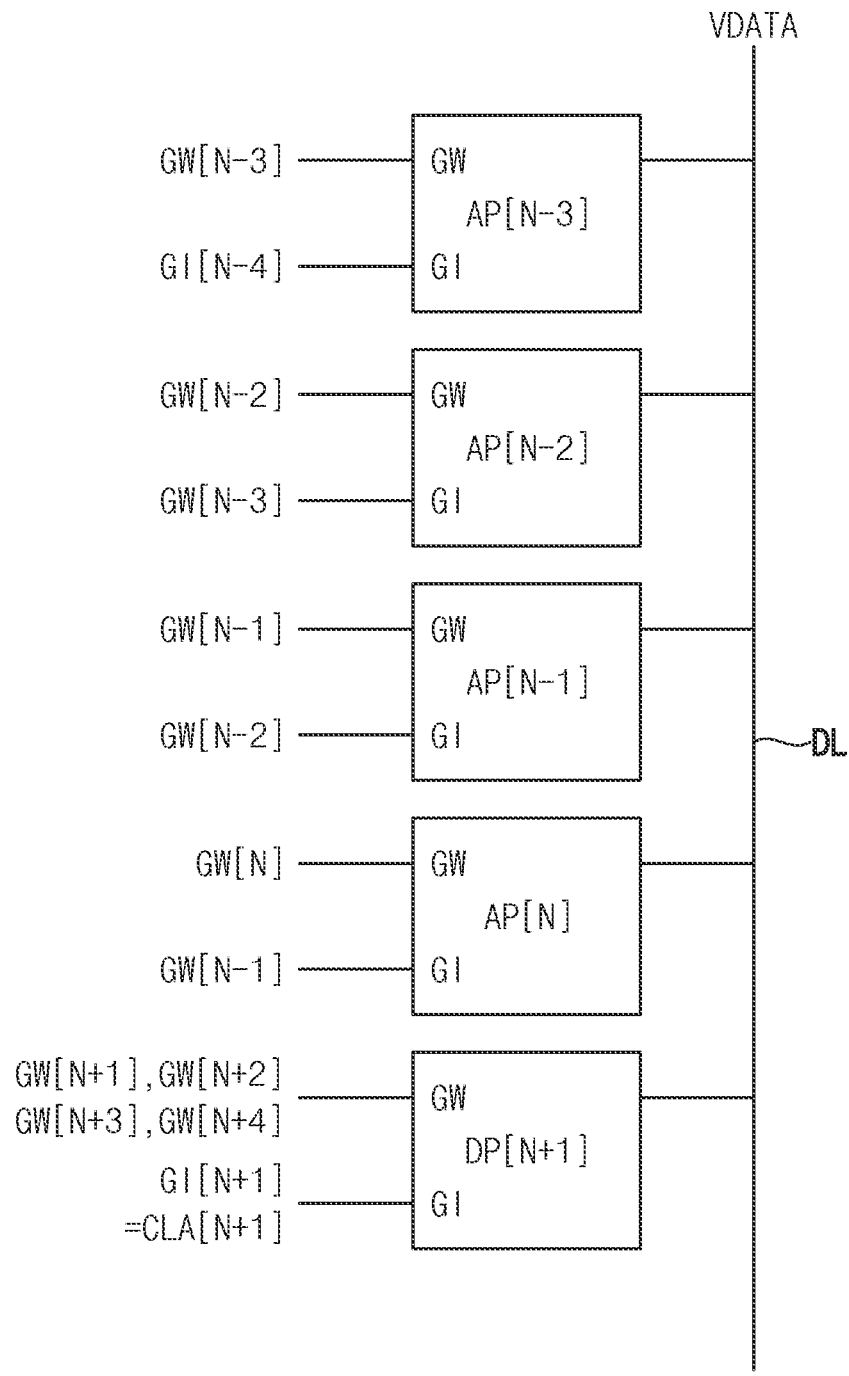
FIG. 4A is a block diagram illustrating an example of a pixel column included in the display device of FIG. 1, according to some embodiments of the present inventive concept.
Figure 4B:
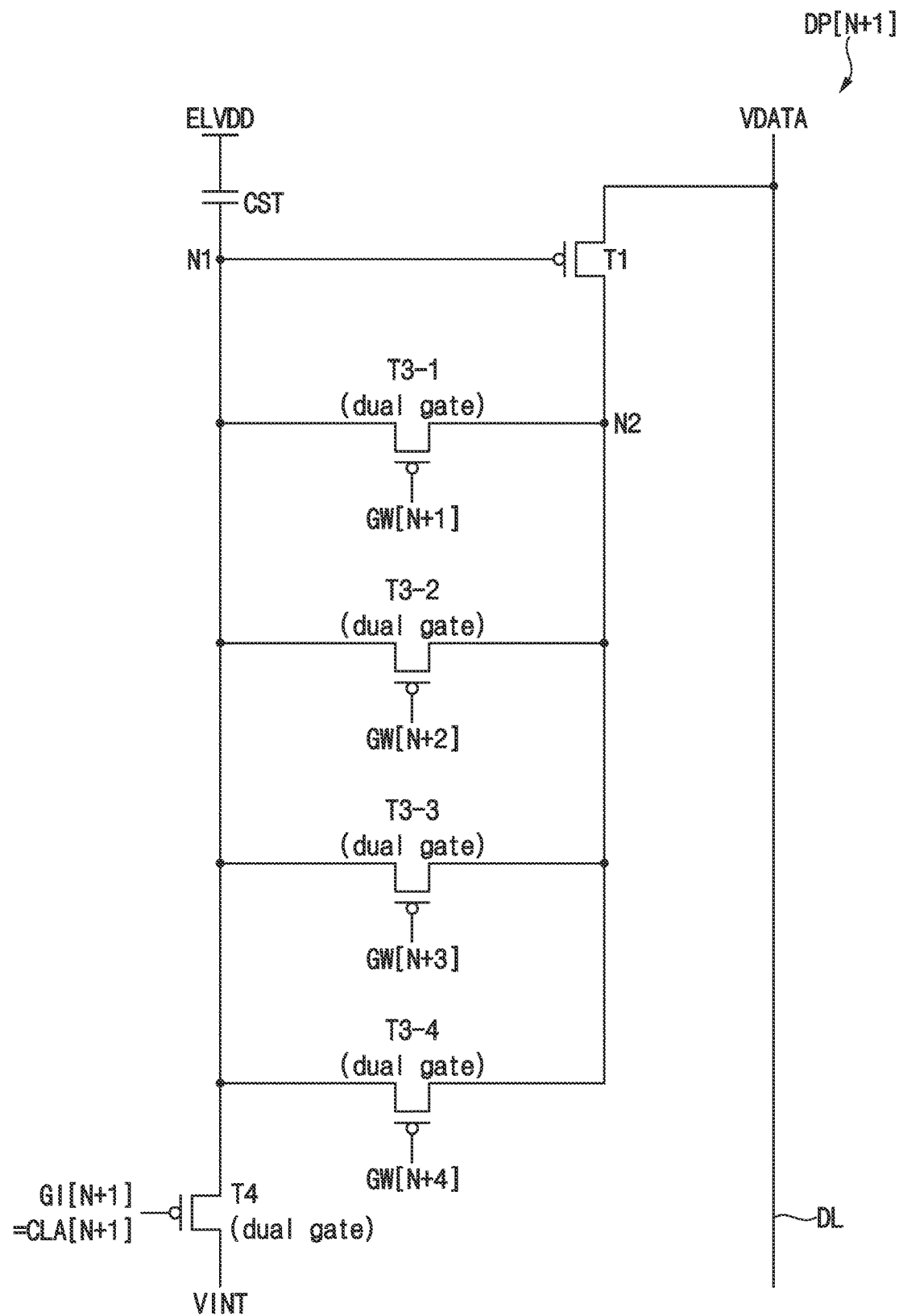
FIG. 4B is a circuit diagram illustrating an example of the dummy pixel included in the pixel column of FIG. 4A, according to some embodiments of the present inventive concept.
Figure 4C:
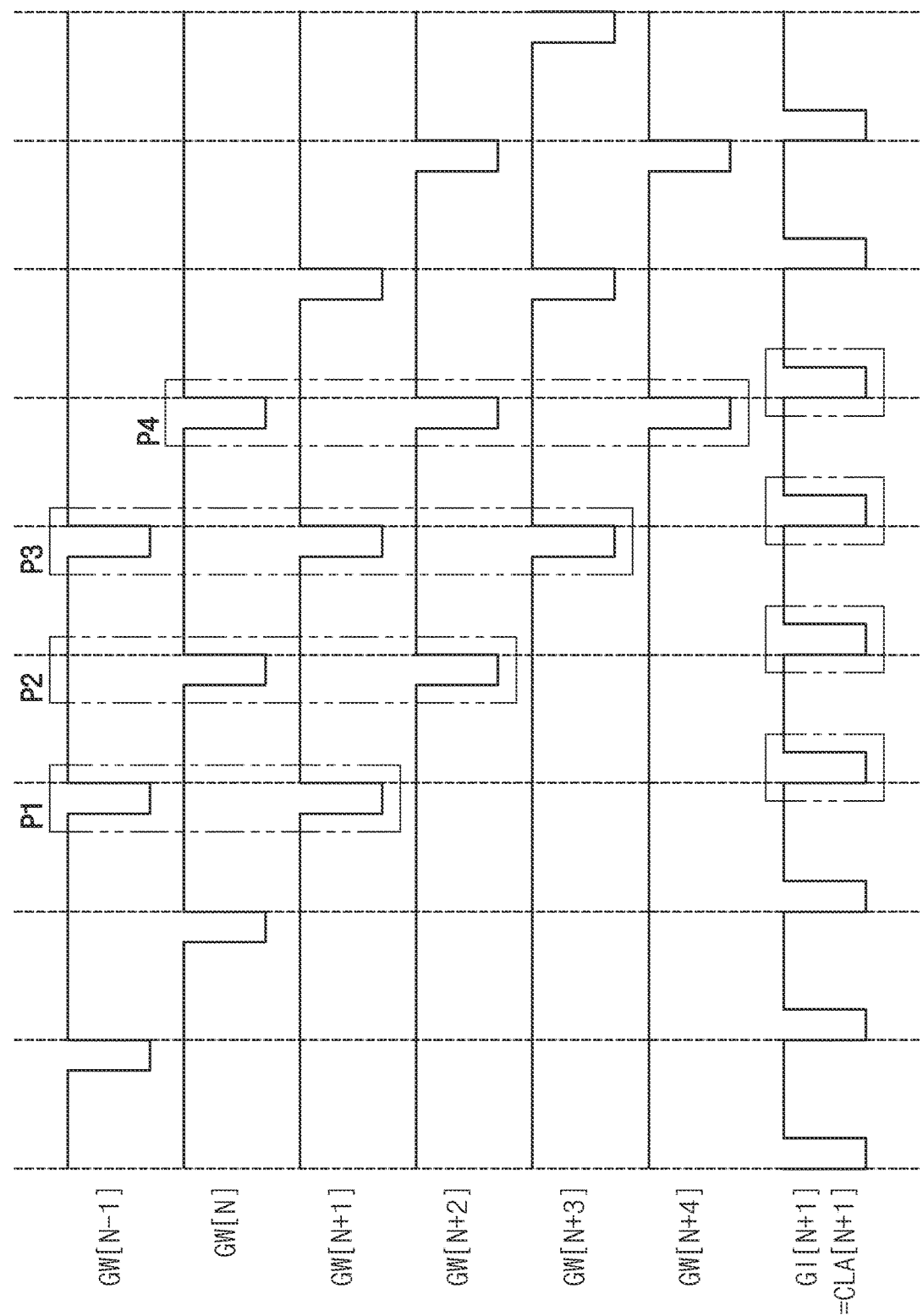
FIG. 4C is a timing diagram illustrating an operation of the dummy pixel of FIG. 4B, according to some embodiments of the present inventive concept.
Figure 4D:
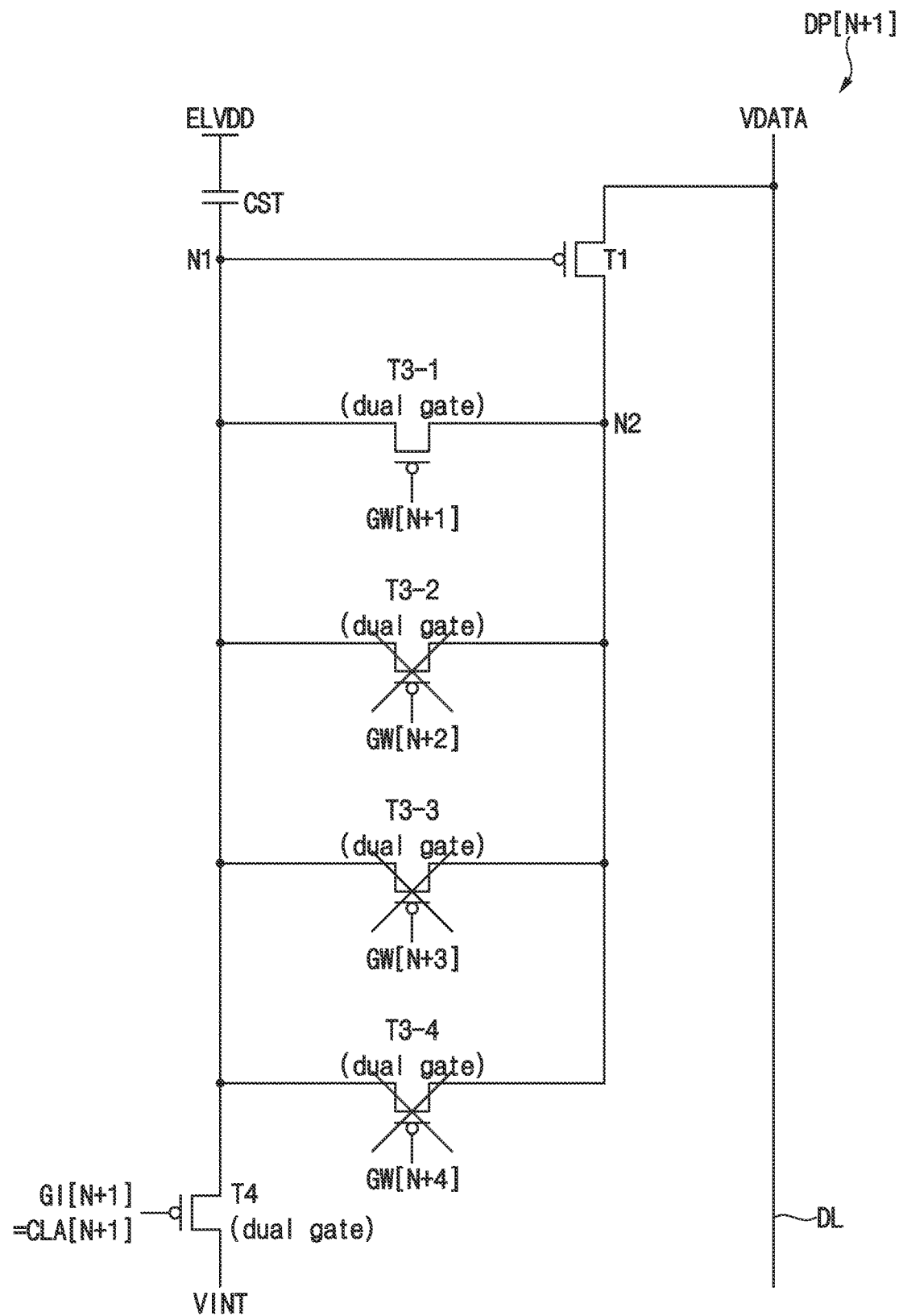
FIGS. 4D to 4G are circuit diagrams illustrating an operation of the dummy pixel of FIG. 4C, according to some embodiments of the present inventive concept.
Figure 4E:
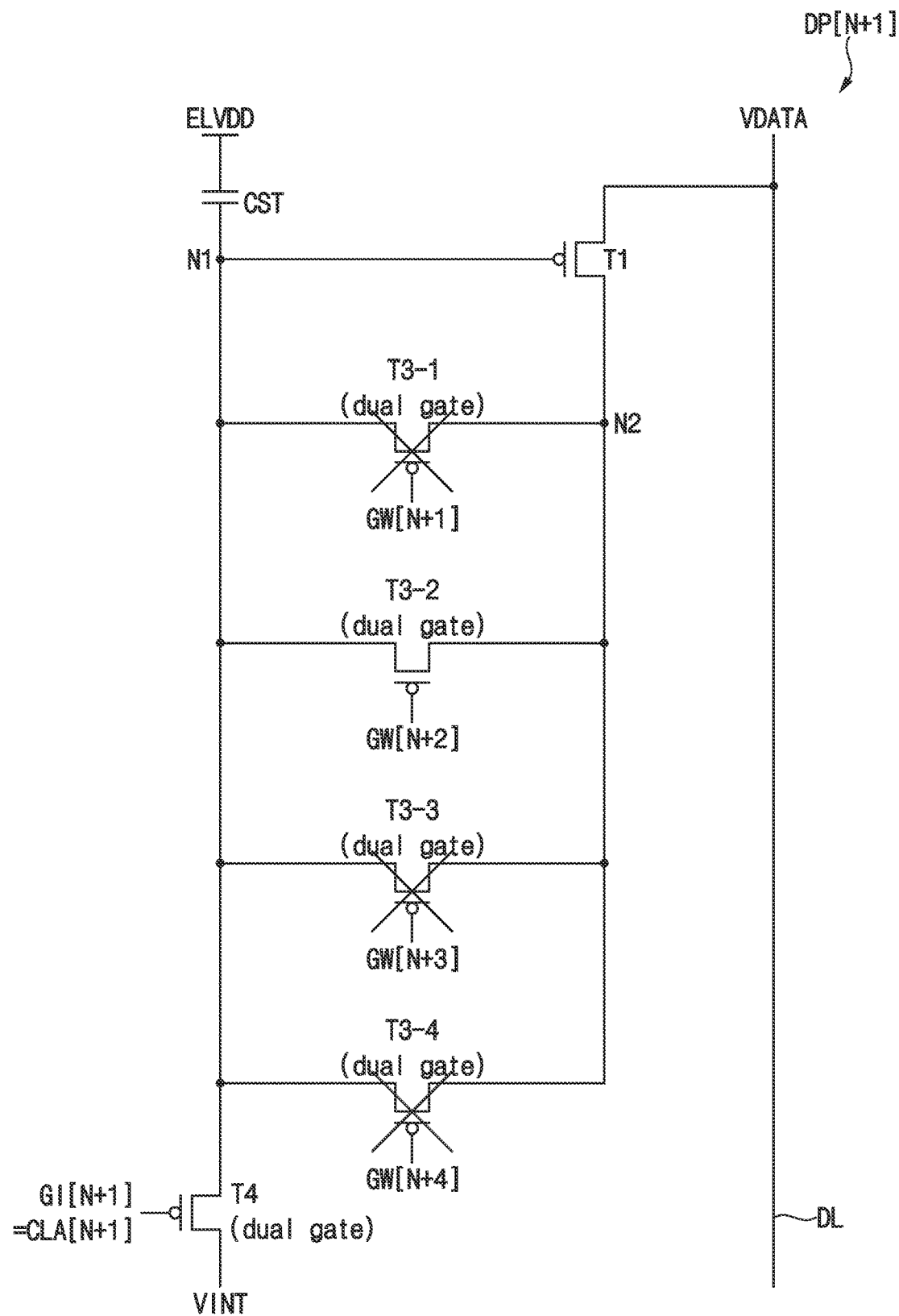
Figure 4F:
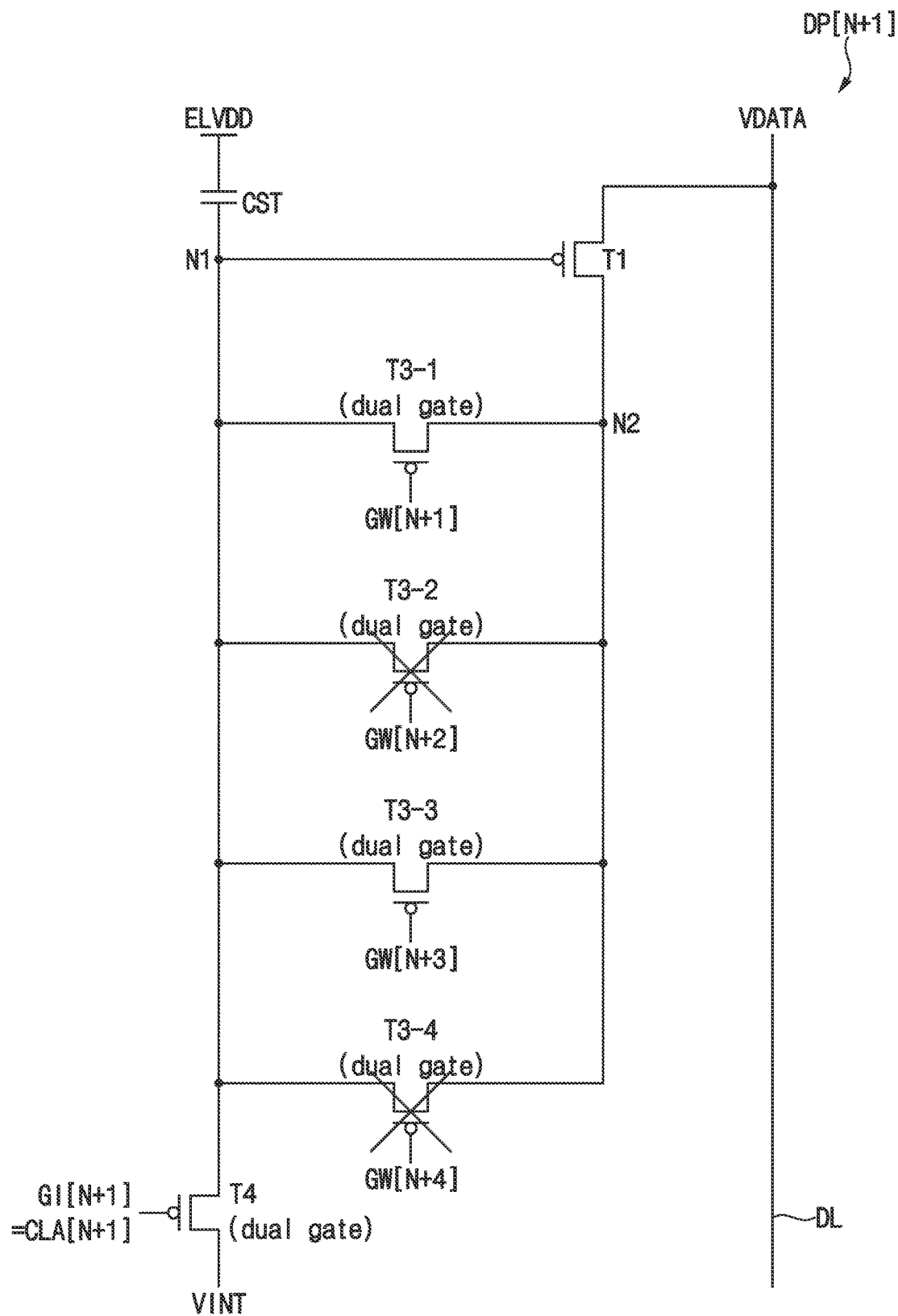
Figure 4G:
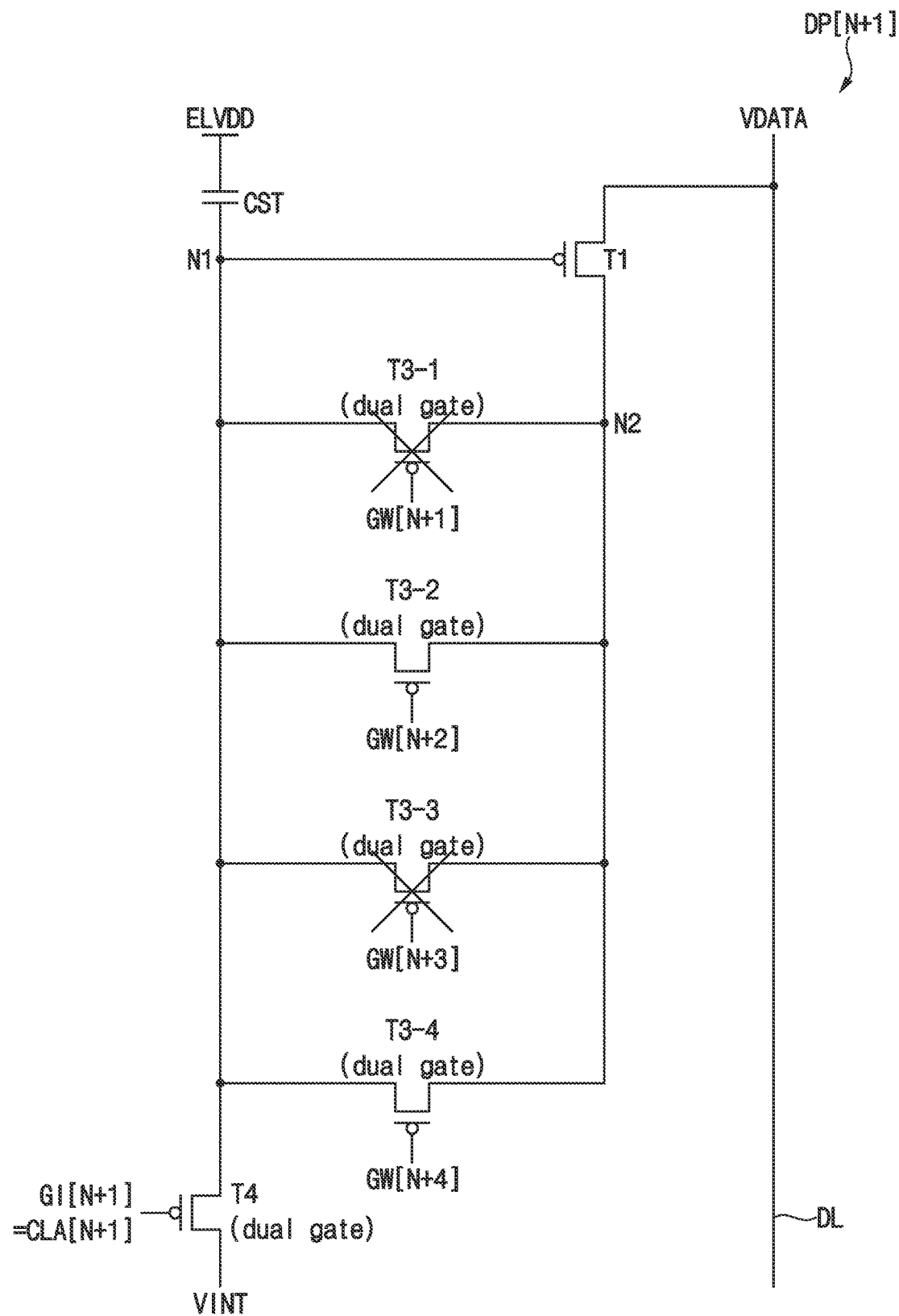
Figure 4H:
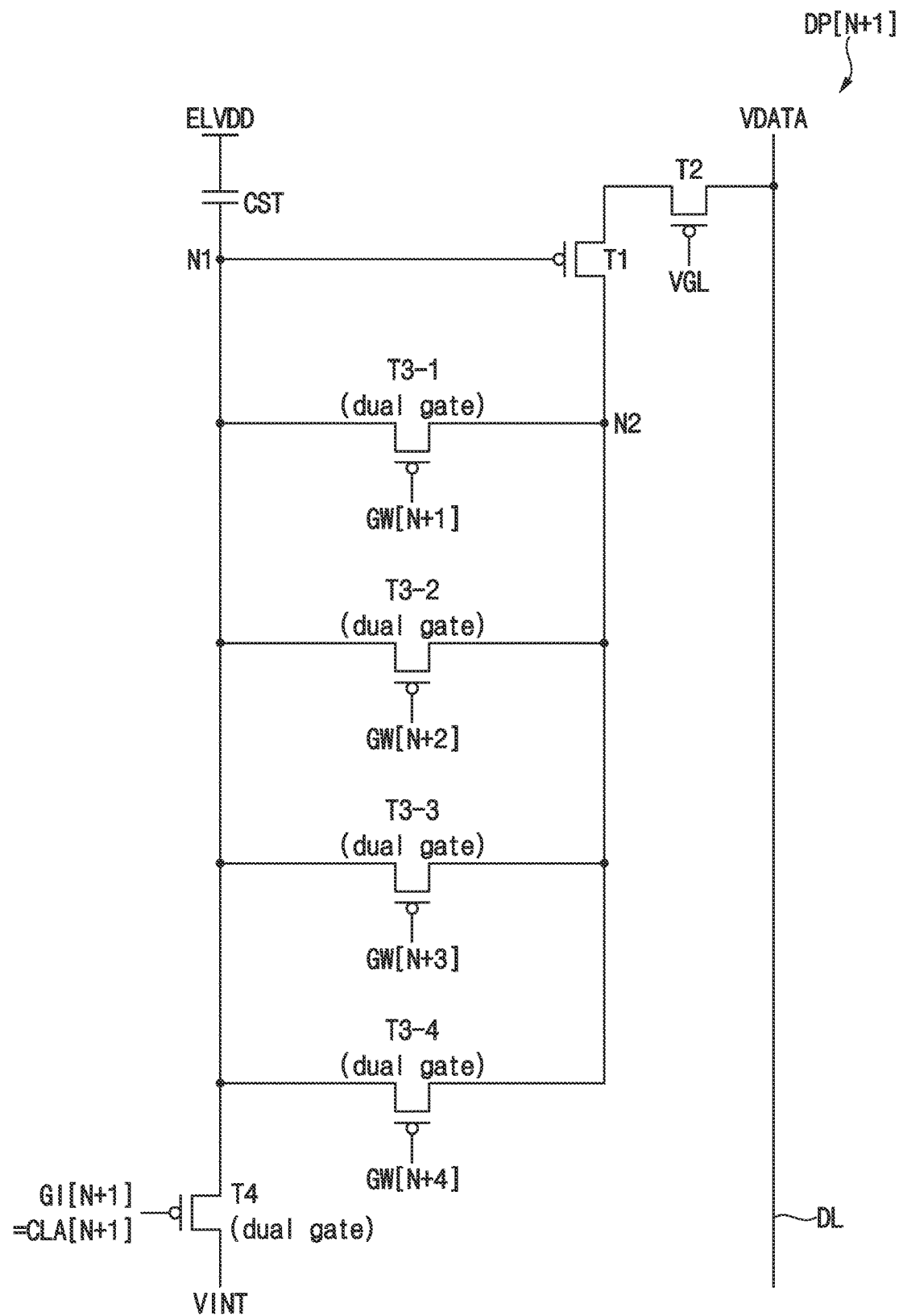
FIG. 4H is a circuit diagram illustrating an example of the dummy pixel of FIG. 4A, according to some embodiments of the present inventive concept.

FIG. 4A is a block diagram illustrating an example of a pixel column included in the display device 10 of FIG. 1, according to some embodiments of the present inventive concept. FIG. 4B is a circuit diagram illustrating an example of the dummy pixel DP[N+1] included in the pixel column of FIG. 4A, according to some embodiments of the present inventive concept. FIG. 4C is a timing diagram illustrating an operation of the dummy pixel DP[N+1] of FIG. 4B, according to some embodiments of the present inventive concept. FIGS. 4D to 4G are circuit diagrams illustrating an operation of the dummy pixel DP[N+1] of FIG. 4C, according to some embodiments of the present inventive concept. FIG. 4H is a circuit diagram illustrating an example of the dummy pixel DP[N+1] of FIG. 4A, according to some embodiments of the present inventive concept.

Referring to FIGS. 1 to 4H, the dummy pixel DP[N+1] of FIG. 4A is substantially the same as the dummy pixel DP[N+1] of FIG. 3A, except that the dummy pixel DP[N+1] of FIG. 4A further includes a dummy third compensation transistor T3-3 and a dummy fourth compensation transistor T3-4, and the write gate signal has three active pulses. Therefore, overlapping descriptions of the same or corresponding components may be omitted.

As illustrated in FIG. 4B, the dummy pixel DP[N+1] may include a dummy driving transistor T1, a plurality of dummy compensation transistors, a dummy initialization transistor T4, and a dummy storage capacitor CST. The dummy compensation transistors may include a dummy first compensation transistor T3-1, a dummy second compensation transistor T3-2, and a dummy third compensation transistor T3-3. In some embodiments, as illustrated in FIG. 4H, the dummy pixel DP[N+1] further includes a dummy write transistor T2 configured to connect the data line DL to the dummy driving transistor T1, and the dummy driving transistor T1 may be turned on at all times.

The dummy compensation transistors may be connected in parallel between a first node N1 and a second node N2. The dummy third compensation transistor T3-3 may include a gate electrode configured to receive an N+3-th write gate signal GW[N+3] (e.g., a third later write gate signal) applied after the N+2-th write gate signal GW[N+2], a first electrode connected to the second node N2, and a second electrode connected to the first node N1. The dummy fourth compensation transistor T3-4 may include a gate electrode configured to receive an N+4-th write gate signal GW[N+4] (e.g., a fourth later write gate signal) applied after the N+3-th write gate signal GW[N+3], a first electrode connected to the second node N2, and a second electrode connected to the first node N1. The N+2-th write gate signal GW[N+2], the N+3-th write gate signal GW[N+3], and the N+4-th write gate signal GW[N+4] may have three active pulses.

In some embodiments, each of the dummy third compensation transistor T3-3 and the dummy fourth compensation transistor T3-4 is a P-type transistor (e.g., a PMOS transistor). In some other embodiments, each of the dummy third compensation transistor T3-3 and the dummy fourth compensation transistor T3-4 is an N-type transistor (e.g., an NMOS transistor).

In some embodiments, the dummy third compensation transistor T3-3 may have a dual gate structure including two gate electrodes. In some embodiments, the dummy fourth compensation transistor T3-4 has a dual gate structure including two gate electrodes.

To improve a luminance difference between the active pixels AP (i.e., the N−3-th active pixel AP[N−3], the N−2-th active pixel AP[N−2], the N−1-th active pixel AP[N−1], and the N-th active pixel AP[N]) arranged adjacent to the dummy pixel DP[N+1], the dummy pixel DP[N+1] may include the dummy compensation transistors T3-1, T3-2, T3-3, and T3-4.

To improve (e.g., increase) the luminance difference between the active pixels AP (e.g., the N−3-th active pixel AP[N−3], the N−2-th active pixel AP[N−2], the N−1-th active pixel AP[N−1], and the N-th active pixel AP[N]) arranged adjacent to the dummy pixel DP[N+1], the dummy compensation transistors T3-1, T3-2, T3-3, and T3-4 may be alternately turned on (e.g., in one period, odds ones of the dummy compensation transistors T3-1, T3-2, T3-3, and T3-4 may be turned on while even ones of the same are turned off, and in a subsequent period, the opposite may occur).

In a first period P1, the N−3-th write gate signal GW[N−3], the N−1-th write gate signal GW[N−1], and the N+1-th write gate signal GW[N+1] may have active pulses. In the first period P1, when the dummy pixel DP[N+1] receives the data voltage VDATA, the dummy first compensation transistor T3-1 is turned on, and the dummy second compensation transistor T3-2, the dummy third compensation transistor T3-3, and the dummy fourth compensation transistor T3-4 are turned off, the N−1-th active pixel AP[N−1] and the N−3-th active pixel AP[N−3] may receive the data voltage VDATA. The data voltage VDATA may be applied to the first node N1 through the dummy first compensation transistor T3-1. Therefore, the dummy storage capacitor CST may store the voltage of the first node N1.

In a second period P2, the N−2-th write gate signal GW[N−2], the N-th write gate signal GW[N], and the N+2-th write gate signal GW[N+2] may have active pulses. In the second period P2, when the dummy pixel DP[N+1] receives the data voltage VDATA, the dummy second compensation transistor T3-2 is turned on, and the dummy first compensation transistor T3-1, the dummy third compensation transistor T3-3, and the dummy fourth compensation transistor T3-4 are turned off, the N-th active pixel AP[N] and the N−2-th active pixel AP[N−2] may receive the data voltage VDATA. The data voltage VDATA may be applied to the first node N1 through the dummy second compensation transistor T3-2. Therefore, the dummy storage capacitor CST may store the voltage of the first node N1.

In a third period P3, the N−1-th write gate signal GW[N−1], the N+1-th write gate signal GW[N+1], and the N+3-th write gate signal GW[N+3] may have active pulses. In the third period P3, when the dummy pixel DP[N+1] receives the data voltage VDATA, the dummy first compensation transistor T3-1 and the dummy third compensation transistor T3-3 are turned on, and the dummy second compensation transistor T3-2 and the dummy fourth compensation transistor T3-4 are turned off, the N−1-th active pixel AP[N−1] may receive the data voltage VDATA. The data voltage VDATA may be applied to the first node N1 through the dummy first compensation transistor T3-1 and the dummy third compensation transistor T3-3. Therefore, the dummy storage capacitor CST may store the voltage of the first node N1.

Figure 5:
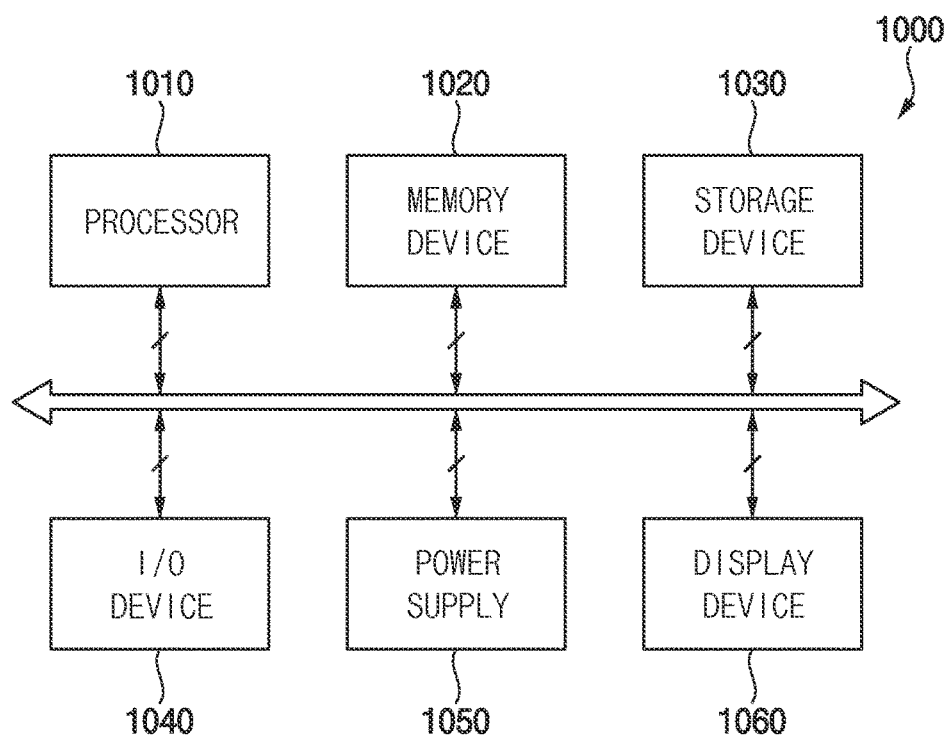
FIG. 5 is a block diagram illustrating an electronic device.
Figure 6:
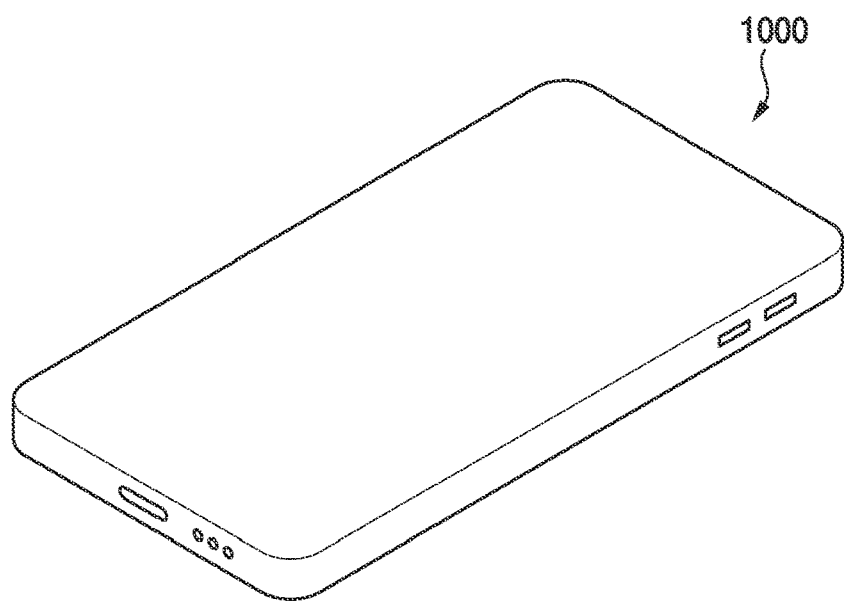
FIG. 6 is a diagram illustrating some embodiments in which the electronic device of FIG. 5 is implemented as a smart phone.

FIG. 5 is a block diagram illustrating an electronic device 1000. FIG. 6 is a diagram illustrating some embodiments in which the electronic device 1000 of FIG. 5 is implemented as a smart phone.

Referring to FIGS. 5 and 6, the electronic device 1000 may include a processor 1010, a memory device 1020, a storage device 1030, an input/output (I/O) device 1040, a power supply 1050, and a display device 1060. The display device 1060 may be the display device 10 of FIG. 1. In addition, the electronic device 1000 may further include a plurality of ports for communicating with a video card, a sound card, a memory card, a universal serial bus (USB) device, other electronic device, and the like.

In some embodiments, as illustrated in FIG. 6, the electronic device 1000 is implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, and the like.

The processor 1010 may perform various computing functions. The processor 1010 may be a microprocessor, a central processing unit (CPU), an application processor (AP), and the like. The processor 1010 may be coupled to other components via an address bus, a control bus, a data bus, and the like. Further, the processor 1010 may be coupled to an extended bus such as a peripheral component interconnection (PCI) bus.

The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like.

The storage device 1030 may include a solid state drive (SSD) device, a hard disk drive (HDD) device, a CD-ROM device, and the like.

The I/O device 1040 may include an input device such as a keyboard, a keypad, a mouse device, a touch-pad, a touch-screen, and the like, and an output device such as a printer, a speaker, and the like. In some embodiments, the I/O device 1040 includes the display device 1060.

The power supply 1050 may provide power for operations of the electronic device 1000.

The display device 1060 may be connected to other components through buses or other communication links.

The inventive concepts may be applied to any display device and any electronic device including the touch panel. For example, the inventive concepts may be applied to a mobile phone, a smart phone, a tablet computer, a digital television (TV), a 3D TV, a personal computer (PC), a home appliance, a laptop computer, a personal digital assistant (PDA), a portable multimedia player (PMP), a digital camera, a music player, a portable game console, a navigation device, etc.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", "in contact with", "in direct contact with", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The display device and/or any other relevant devices or components according to embodiments of the present invention described herein may be implemented utilizing any suitable hardware, firmware (e.g., an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and features of the inventive concept. Accordingly, all such modifications are intended to be included within the scope of the inventive concept as defined by the claims and equivalents thereof. In the claims, means-plus-function clauses are intended to cover the structures described herein as performing the recited function and not only structural equivalents but also equivalent structures.

What is claimed is:

1. A display panel comprising:
a plurality of active pixels comprising a first active pixel to an N-th active pixel, N being a natural number of 4 or more; and
a dummy pixel arranged adjacent to the N-th active pixel in a same pixel column, the dummy pixel comprising:
a dummy driving transistor comprising a gate electrode connected to a first node, a first electrode connected to a data line configured to transmit a data voltage, and a second electrode connected to a second node;
a plurality of dummy compensation transistors connected in parallel to each other between the first node and the second node;
a dummy initialization transistor comprising a gate electrode configured to receive an initialization gate signal, a first electrode configured to receive an initialization voltage, and a second electrode connected to the first node; and
a dummy storage capacitor comprising a first electrode configured to receive a first supply voltage and a second electrode connected to the first node.

2. The display panel of claim 1, wherein the dummy compensation transistors comprise:
a dummy first compensation transistor comprising a gate electrode configured to receive a write gate signal having two active pulses, a first electrode connected to the second node, and a second electrode connected to the first node; and
a dummy second compensation transistor comprising a gate electrode configured to receive a first later write gate signal applied after the write gate signal, a first electrode connected to the second node, and a second electrode connected to the first node.

3. The display panel of claim 2, wherein an N−1-th active pixel of the plurality of active pixels is configured to receive the data voltage when the dummy pixel receives the data voltage, the dummy first compensation transistor is turned on, and the dummy second compensation transistor is turned off.

4. The display panel of claim 2, wherein the N-th active pixel is configured to receive the data voltage when the dummy pixel receives the data voltage, the dummy second compensation transistor is turned on, and the dummy first compensation transistor is turned off.

5. The display panel of claim 2, wherein active pulses of the write gate signal do not overlap active pulses of the first later write gate signal.

6. The display panel of claim 2, wherein the dummy first compensation transistor and the dummy second compensation transistor are alternately turned on.

7. The display panel of claim 2, wherein active pulses of the initialization gate signal do not overlap active pulses of the write gate signal and active pulses of the first later write gate signal.

8. The display panel of claim 1, further comprising:
a dummy write transistor configured to connect the data line to the first electrode of the dummy driving transistor,
wherein the dummy write transistor is turned on at all times.

9. The display panel of claim 1, wherein the dummy compensation transistors comprise:
a dummy first compensation transistor comprising a gate electrode configured to receive a write gate signal having three active pulses, a first electrode connected to the second node, and a second electrode connected to the first node;
a dummy second compensation transistor comprising a gate electrode configured to receive a first later write gate signal applied after the write gate signal, a first electrode connected to the second node, and a second electrode connected to the first node;
a dummy third compensation transistor comprising a gate electrode configured to receive a second later write gate signal applied after the first later write gate signal, a first electrode connected to the second node, and a second electrode connected to the first node; and
a dummy fourth compensation transistor comprising a gate electrode configured to receive a third later write gate signal applied after the second later write gate signal, a first electrode connected to the second node, and a second electrode connected to the first node.

10. The display panel of claim 9, wherein an N−1-th active pixel and an N−3-th active pixel of the plurality of active pixels are configured to receive the data voltage when the dummy pixel receives the data voltage, the dummy first compensation transistor is turned on, and the dummy second compensation transistor, the dummy third compensation transistor, and the dummy fourth compensation transistor are turned off.

11. The display panel of claim 9, wherein the N-th active pixel and an N−2-th active pixel of the plurality of active pixels are configured to receive the data voltage when the dummy pixel receives the data voltage, the dummy second compensation transistor is turned on, and the dummy first compensation transistor, the dummy third compensation transistor, and the dummy fourth compensation transistor are turned off.

12. The display panel of claim 9, wherein an N−1-th active pixel of the plurality of active pixels is configured to receive the data voltage when the dummy pixel receives the data voltage, the dummy first compensation transistor and the dummy third compensation transistor are turned on, and the dummy second compensation transistor and the dummy fourth compensation transistor are turned off.

13. The display panel of claim 9, wherein the N-th active pixel is configured to receive the data voltage when the dummy pixel receives the data voltage, the dummy second compensation transistor and the dummy fourth compensation transistor are turned on, and the dummy first compensation transistor and the dummy third compensation transistor are turned off.

14. The display panel of claim 9, wherein active pulses of the first later write gate signal do not overlap active pulses of the write gate signal and active pulses of the second later write gate signal.

15. The display panel of claim 9, wherein the dummy first compensation transistor, the dummy second compensation transistor, the dummy third compensation transistor, and the dummy fourth compensation transistor are alternately turned on.

16. The display panel of claim 9, wherein active pulses of the initialization gate signal do not overlap active pulses of the write gate signal, active pulses of the first later write gate signal, and active pulses of the second later write gate signal.

17. The display panel of claim 9, further comprising:
a dummy write transistor configured to connect the data line to the first electrode of the dummy driving transistor,
wherein the dummy write transistor is turned on at all times.

18. The display panel of claim 1, wherein the dummy compensation transistors have a dual gate structure comprising two gate electrodes, and wherein the dummy initialization transistor has a dual gate structure comprising two gate electrodes.

19. A display device comprising:

a display panel comprising a plurality of active pixels comprising a first active pixel to an N-th active pixel and a dummy pixel arranged adjacent to the N-th active pixel in a same pixel column, N being a natural number of 4 or more; and a display panel driver configured to drive the display panel, wherein the dummy pixel comprises:

a dummy driving transistor comprising a gate electrode connected to a first node, a first electrode connected to a data line configured to transmit a data voltage, and a second electrode connected to a second node;

a plurality of dummy compensation transistors connected in parallel to each other between the first node and the second node;

a dummy initialization transistor comprising a gate electrode configured to receive an initialization gate signal, a first electrode configured to receive an initialization voltage, and a second electrode connected to the first node; and a dummy storage capacitor comprising a first electrode configured to receive a first supply voltage and a second electrode connected to the first node.

20. The display device of claim 19, wherein the dummy compensation transistors comprise:

a dummy first compensation transistor comprising a gate electrode configured to receive a write gate signal having two active pulses, a first electrode connected to the second node, and a second electrode connected to the first node; and a dummy second compensation transistor comprising a gate electrode configured to receive a first later write gate signal applied after the write gate signal, a first electrode connected to the second node, and a second electrode connected to the first node.

* * * * *